United States Patent
Cox et al.

(10) Patent No.: US 11,552,650 B2
(45) Date of Patent: Jan. 10, 2023

(54) METHODS TO COMPRESS RANGE DOPPLER MAP (RDM) VALUES FROM FLOATING POINT TO DECIBELS (DB)

(71) Applicant: Raytheon Company, Waltham, MA (US)

(72) Inventors: Lloyd Cox, Tucson, AZ (US); Matti R. Ingraham, Tucson, AZ (US); David R. Mielke, Tucson, AZ (US); Dan R. Sheen, Tucson, AZ (US); Rhett Hayden, Oro Valley, AZ (US)

(73) Assignee: Raytheon Company, Waltham, MA (US)

( * ) Notice: Subject to any disclaimer, the term of this patent is extended or adjusted under 35 U.S.C. 154(b) by 171 days.

(21) Appl. No.: 16/592,509

(22) Filed: Oct. 3, 2019

(65) Prior Publication Data
US 2021/0273647 A1    Sep. 2, 2021

(51) Int. Cl.
*H03M 7/24*    (2006.01)
*G06F 1/03*    (2006.01)
(Continued)

(52) U.S. Cl.
CPC .......... *H03M 7/24* (2013.01); *G06F 1/0307* (2013.01); *G06F 7/485* (2013.01); *G06F 7/4876* (2013.01); *G06F 7/49947* (2013.01)

(58) Field of Classification Search
CPC ........ H03M 7/24; G06F 1/0307; G06F 7/485; G06F 7/4876; G06F 7/49947; H03G 3/3042
See application file for complete search history.

(56) References Cited

U.S. PATENT DOCUMENTS

| 4,680,588 A | 7/1987 | Cantwell |
| 4,908,785 A | 3/1990 | Cubbins et al. |

(Continued)

FOREIGN PATENT DOCUMENTS

WO    WO-2021066933 A1    4/2021

OTHER PUBLICATIONS

N. Alachiotis and A. Stamatakis, "Efficient floating-point logarithm unit for FPGAs," 2010 IEEE International Symposium on Parallel & Distributed Processing, Workshops and Phd Forum (IPDPSW), 2010, pp. 1-8, doi: 10.1109/IPDPSW.2010.5470752. (Year: 2010).*

(Continued)

*Primary Examiner* — Emily E Larocque
*Assistant Examiner* — Huy Duong
(74) *Attorney, Agent, or Firm* — Kinney & Lange, P.A.

(57) ABSTRACT

Embodiments of a telemetry device and methods to convert a binary floating point number to a compressed number is described herein. The binary floating point number may comprise a mantissa and an exponent. The telemetry device may determine a first number based on a product of the exponent and a constant, wherein the constant may be proportional to a logarithm of the number two. The telemetry device may determine a second number using one or more bits of the mantissa as an index into a predetermined lookup table. Values of the lookup table may be proportional to logarithms of candidate mantissa values. The telemetry device may determine the compressed number based on rounding of a sum. The sum may include the first and second numbers. The rounding may be based on a predetermined step size.

17 Claims, 7 Drawing Sheets

(51) Int. Cl.
*G06F 7/485* (2006.01)
*G06F 7/487* (2006.01)
*G06F 7/499* (2006.01)

(56) References Cited

U.S. PATENT DOCUMENTS

| | | | | |
|---|---|---|---|---|
| 5,995,122 | A | * | 11/1999 | Hsieh .................. G06T 1/20 345/561 |
| 6,396,420 | B1 | | 5/2002 | Augustine |
| 6,882,753 | B2 | | 4/2005 | Chen et al. |
| 7,333,567 | B2 | | 2/2008 | Ma et al. |
| 7,586,928 | B2 | | 9/2009 | Mao |
| 8,498,760 | B2 | | 7/2013 | Kaas et al. |
| 8,755,621 | B2 | | 6/2014 | Chiang et al. |
| 9,076,217 | B2 | | 7/2015 | Wang et al. |
| 9,104,473 | B2 | | 8/2015 | Wegener |
| 9,118,345 | B2 | | 8/2015 | Wegener |
| 9,172,771 | B1 | | 10/2015 | Gross et al. |
| 9,660,667 | B2 | | 5/2017 | Kang et al. |
| 9,753,666 | B2 | | 9/2017 | Gopal et al. |
| 2003/0014453 | A1 | * | 1/2003 | Challa .................. G06F 7/5235 708/277 |
| 2005/0135506 | A1 | * | 6/2005 | Ma ..................... H03G 3/3042 375/316 |
| 2016/0021216 | A1 | | 1/2016 | Ashworth et al. |
| 2017/0083287 | A1 | * | 3/2017 | Yu ...................... G06F 7/5525 |
| 2017/0264311 | A1 | | 9/2017 | Miyamae |
| 2018/0095155 | A1 | * | 4/2018 | Soni ................... G01S 19/015 |

OTHER PUBLICATIONS

M. Haselman, M. Beauchamp, A. Wood, S. Hauck, K. Underwood and K. S. Hemmert, "A comparison of floating point and logarithmic number systems for FPGAs," 13th Annual IEEE Symposium on Field-Programmable Custom Computing Machines (FCCM'05), 2005, pp. 181-190, doi: 10.1109/FCCM.2005.6. (Year: 2005).*

Matthiaspaul. "Single-Precision Floating-Point Format." Wikipedia, Wikimedia Foundation, May 29, 2016, en.wikipedia.org/w/index.php?title=Single-precision_floating-point_format&oldid=722732762. (Year: 2016).*

Biddulph, David. "Decibel." Wikipedia, Wikimedia Foundation, Dec. 13, 2017, en.wikipedia.org/w/index.php?title=Decibel&oldid=815210851. (Year: 2017).*

"International Application Serial No. PCT US2020 044747, International Search Report dated Oct. 21, 2020", 3 pgs.

"International Application Serial No. PCT US2020 044747, Written Opinion dated Oct. 21, 2020", 7 pgs.

Isenburg, Martin, et al., "Lossless Compression of Floating-Point Geometry", CAD'04, (2004), 7 pgs.

Isenburg, Martin, et al., "Lossless Compression of Predicted Floating-Point Geometry", (Jul. 10, 2004), 13 pgs.

* cited by examiner

METHODS TO COMPRESS RANGE DOPPLER MAP (RDM) VALUES FROM FLOATING POINT TO DECIBELS (DB)

GOVERNMENT RIGHTS

This invention was made with government support under Contract Number N00024-15-C-5420 awarded by the Department of Defense. The U.S. Government has certain rights in this invention.

TECHNICAL FIELD

Some embodiments pertain to floating point numbers. Some embodiments pertain to decibel (dB) numbers. Some embodiments relate to conversion between different number formats, including conversion from floating point to dB. Some embodiments relate to compression of numbers, including compression of floating point numbers to dB numbers. Some embodiments pertain to telemetry, range Doppler maps (RDMs), telemetry links and/or transmission of data (including RDMs) over telemetry links.

BACKGROUND

In some systems, feedback sent from a device may be subject to various performance requirements in terms of latency, bandwidth and/or other factors. In a non-limiting example, instantaneous operating parameters of an airborne device may be processed by a receiving station to control the speed, path, destination and/or other aspects of the airborne device. This process may be performed in near real-time, in some scenarios, meaning that a target latency of the feedback sent from the airborne device may be very low. Factors such as the latency, available bandwidth, reliability and/or others may be crucial in this scenario and in other scenarios.

DETAILED DESCRIPTION

Figure 1:
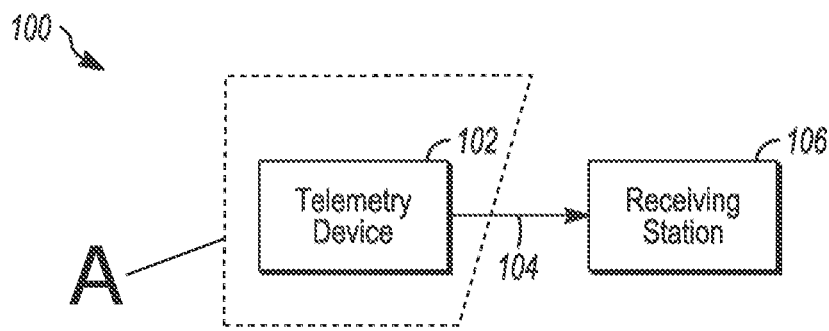
FIG. 1 illustrates an example scenario in accordance with some embodiments.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

In the system 100, a telemetry device 102 may sit within an airborne device A. The telemetry device 102 may transmit information to a receiving station 106 over a telemetry link 104. The telemetry device 102 may perform one or more operations described herein, such as conversion of numbers from binary floating point format to a compressed format. Although some techniques, operations and/or methods may be described herein in terms of the scenario 100, the scope of embodiments is not limited to scenario 100. The scope of embodiments is also not limited to the number, type, arrangement or other aspects of the components shown in FIG. 1. Some embodiments may not necessarily include all components shown in the example scenario 100. Some embodiments may include additional components not shown in the example scenario 100. Some embodiments may include the telemetry device 102 sitting outside the airborne device A.

In a non-limiting example, a device other than the telemetry device 102 may perform one or more of the techniques, operations and/or methods described herein, in some embodiments.

In another non-limiting example, the telemetry device 102 and/or other device may perform one or more of the techniques, operations and/or methods described herein. Information (such as a compressed number, which is described herein) may be generated as a result of the techniques, operations and/or methods. In some embodiments, the telemetry device 102 and/or other device may not necessarily communicate that information to another device (such as the receiving station 106 and/or other device). For instance, the telemetry device 102 and/or other device may store that information without necessarily sending it to another device. In some embodiments, the telemetry device 102 and/or other device may communicate that information with another device (such as the receiving station 106 and/or other device) over a medium other than the telemetry link 104 (such as another wireless link, a wired link and/or other medium). In some embodiments, the telemetry device 102 and/or other device may communicate that information to a device other than the receiving station 106.

Figure 2:
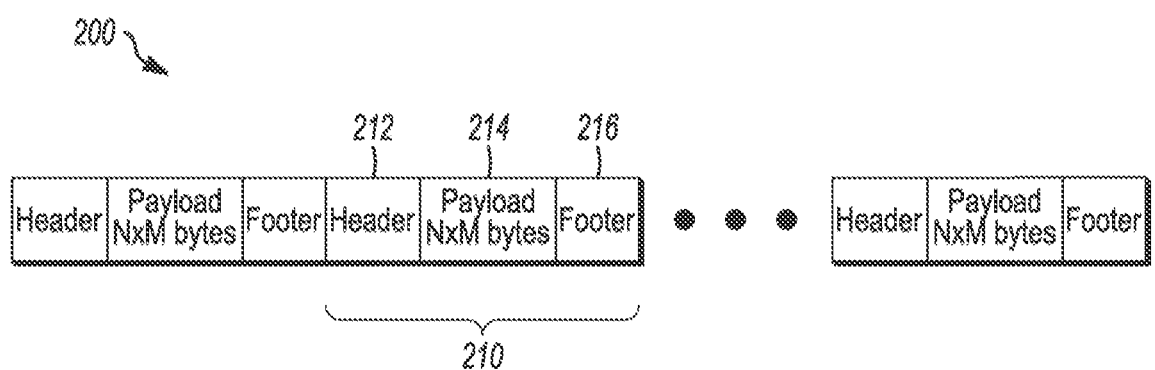
FIG. 2 illustrates example packets that may be transmitted in accordance with some embodiments.

FIG. 2 illustrates example packets that may be transmitted in accordance with some embodiments. In a non-limiting example, one or more packets 210 may be transmitted. The packet 210 may include one or more of: a header 212, a payload 214, a footer 216 and/or other element(s).

The scope of embodiments is not limited to the number, type, arrangement and/or other aspects of the elements (such as the packets 210 and/or fields of the packets 210) shown in FIG. 1. One or more of the techniques, operations and/or methods described herein may be performed using the payload 214 (such as conversion/compression of the payload 214 and/or other), although the scope of embodiments is not limited in this respect. One or more of the techniques, operations and/or methods described herein may be performed using a packet (such as a packet 210 and/or other), although the scope of embodiments is not limited in this respect. For instance, one or more of the techniques, operations and/or methods described herein (such as conversion, compression and/or other) may be performed on an element other than a packet, such as a number, a value, a field and/or other, in some embodiments.

In some embodiments, the packets may be sent in real time (and/or in near real time), although the scope of embodiments is not limited in this respect. In some embodiments, the packets may be sent over the telemetry link 104, although the scope of embodiments is not limited in this respect.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware. Embodiments described herein may be implemented into a system using any suitably configured hardware and/or software.

Figure 3:
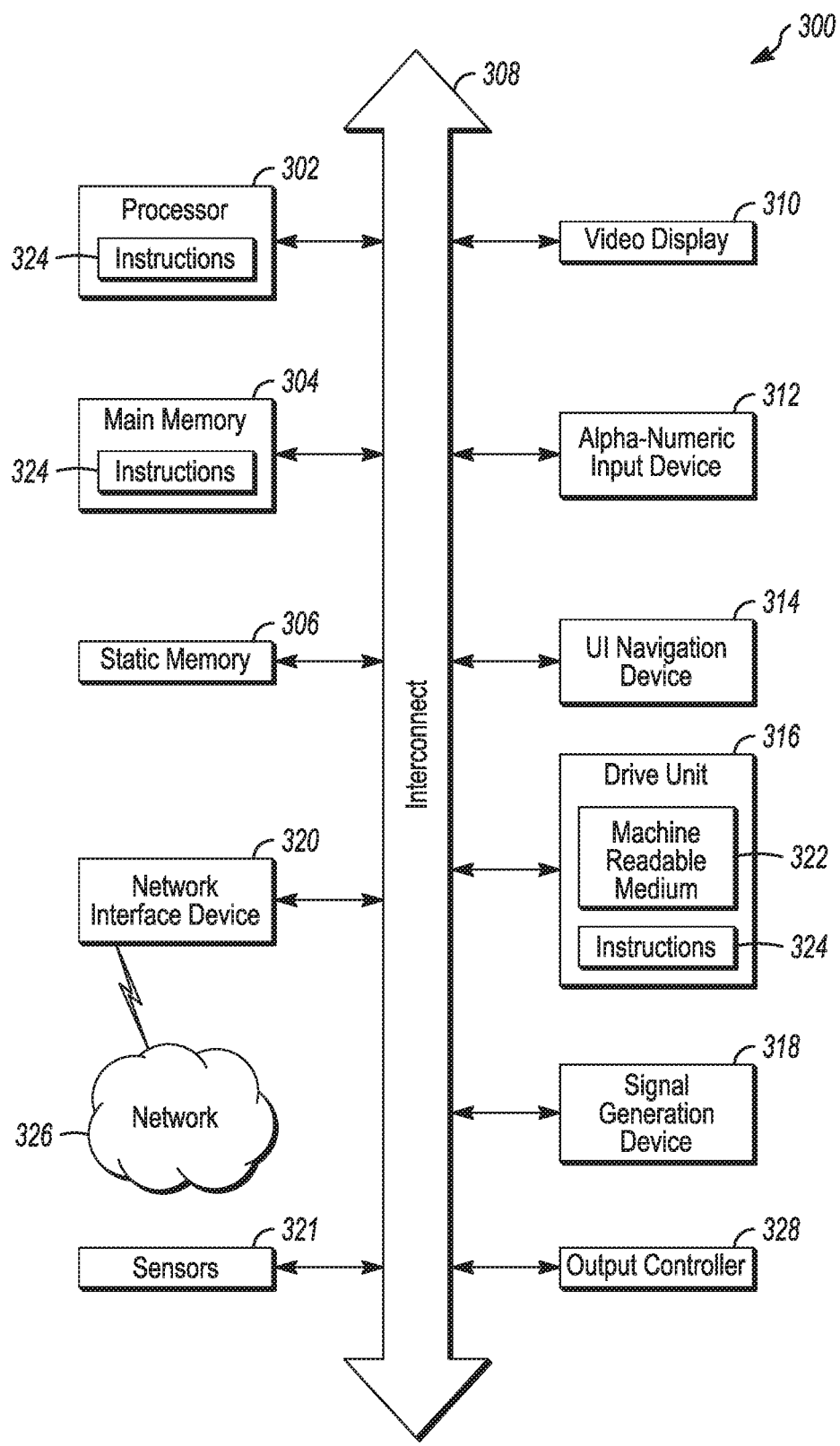
FIG. 3 illustrates a block diagram of an example machine in accordance with some embodiments.

FIG. 3 illustrates a block diagram of an example machine in accordance with some embodiments. In some embodiments, the telemetry device 102 and/or other device may include one or more components shown in FIG. 3. For instance, the machine readable medium 322 may be used to implement one or more operations of the telemetry device 102 and/or other device, in some cases. In some embodiments, the machine 300 may be a device that includes the telemetry device 102. As an example, the telemetry device 102, an airborne device, an aircraft, a missile and/or other device may perform communication operations using one or more components from FIG. 3. In some embodiments, the machine 300 or one or more components of the machine 300 may be configurable to transmit elements such as packets, numbers, values, fields, compressed numbers and/or other.

Any one or more of the techniques (e.g., methodologies) discussed herein may be performed on such a machine 300, in some embodiments. In alternative embodiments, the machine 300 may operate as a standalone device or may be connected (e.g., networked) to other machines. In a networked deployment, the machine 300 may operate in the capacity of a server machine, a client machine, or both in server-client network environments. In an example, the machine 300 may act as a peer machine in peer-to-peer (P2P) (or other distributed) network environment. In some embodiments, the machine 300 may be a telemetry device, an airborne device, a missile, an aircraft, a cryptographic device, personal computer (PC), a tablet PC, a set-top box (STB), a personal digital assistant (PDA), a mobile device, a base station, an access point (AP) arranged to operate in accordance with an IEEE 802.11 protocol and/or a wireless local area network (WLAN) protocol, a station (STA) arranged to operate in accordance with an IEEE 802.11 protocol and/or a wireless local area network (WLAN) protocol, a User Equipment (UE) arranged to operate in accordance with a Third Generation Partnership Project (3GPP) protocol (including Long Term Evolution (LTE) protocols), an Evolved Node-B (eNB) arranged to operate in accordance with a 3GPP protocol (including LTE protocols), a mobile telephone, a smart phone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

As a non-limiting example, a module may include a group of components connected to (permanently, temporarily and/or semi-permanently) a circuit board, processor board and/or other medium.

Machine (e.g., computer system) 300 may include a hardware processor 302 (e.g., a central processing unit (CPU), a graphics processing unit (GPU), a hardware processor core, or any combination thereof), a main memory 304 and a static memory 306, some or all of which may communicate with each other via an interlink (e.g., bus) 308. In some embodiments, components of the machine 300 may communicate with each other via optical interfaces, waveguides and/or other circuitry configured to exchange optical signals. In some embodiments, the interconnect 308 may be configured to communicate optical signals and/or other signals between components of the machine 300.

The machine 300 may further include a display unit 310, an alphanumeric input device 312 (e.g., a keyboard), and a user interface (UI) navigation device 314 (e.g., a mouse). In an example, the display unit 310, input device 312 and UI navigation device 314 may be a touch screen display. The machine 300 may additionally include a storage device (e.g., drive unit) 316, a signal generation device 318 (e.g., a speaker), a network interface device 320, and one or more sensors 321, such as a global positioning system (GPS) sensor, compass, accelerometer, or other sensor. The machine 300 may include an output controller 328, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 316 may include a machine readable medium 322 on which is stored one or more sets of data structures or instructions 324 (e.g., software) embodying or utilized by any one or more of the techniques or functions described herein. The instructions 324 may also reside, completely or at least partially, within the main memory 304, within static memory 306, or within the hardware processor 302 during execution thereof by the machine 300. In an example, one or any combination of the hardware processor 302, the main memory 304, the static memory 306, or the storage device 316 may constitute machine readable media.

While the machine readable medium 322 is illustrated as a single medium, the term "machine readable medium" may include a single medium or multiple media (e.g., a centralized or distributed database, and/or associated caches and servers) configured to store the one or more instructions 324.

The term "machine readable medium" may include any medium that is capable of storing, encoding, or carrying instructions for execution by the machine 300 and that cause the machine 300 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, machine readable media may include non-transitory machine readable media. In some examples, machine readable media may include machine readable media that is not a transitory propagating signal.

The instructions 324 may further be transmitted or received over a communications network 326 using a transmission medium via the network interface device 320 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 320 may include one or more physical jacks (e.g., Ethernet, coaxial, or phone jacks) or one or more antennas to connect to the communications network 326. In an example, the network interface device 320 may include a plurality of antennas to wirelessly communicate using at least one of single-input multiple-output (SIMO), multiple-input multiple-output (MIMO), or multiple-input single-output (MISO) techniques. In some examples, the network interface device 320 may wirelessly communicate using Multiple User MIMO techniques. The term "transmission medium" shall be taken to include any intangible medium that is capable of storing, encoding or carrying instructions for execution by the machine 300, and includes digital or analog communications signals or other intangible medium to facilitate communication of such software.

Although the telemetry device 102 and machine 300 may be illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some embodiments, the functional elements may refer to one or more processes operating on one or more processing elements. Embodiments may be implemented in one or a combination of hardware, firmware and software. Embodiments may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. Some embodiments may include one or more processors and may be configured with instructions stored on a computer-readable storage device.

It should be noted that in some embodiments, an apparatus of a telemetry device 102 may include various components of the example machine 300 shown in FIG. 3 and/or other component(s). Accordingly, in some cases, techniques and operations described herein that refer to the telemetry device 102 may be applicable to an apparatus of a telemetry device.

In accordance with some embodiments, the telemetry device 102 may receive, from a sensor, a range Doppler map (RDM) value in a binary floating point format. The RDM value may comprise an exponent comprising bits. The RDM value may comprise a mantissa comprising bits. The telemetry device 102 may convert the RDM value to a compressed RDM value in decibels (dB). The compressed RDM value may comprise a plurality of bits. The telemetry device 102 may determine a first number based on a product of the exponent and a constant. The constant may be proportional to a logarithm of the number two. The telemetry device 102 may determine a second number using one or more bits of the mantissa as an index into a predetermined lookup table. Values of the lookup table may be proportional to logarithms of candidate mantissa values. The telemetry device 102 may determine the compressed RDM value based on rounding of a sum. The sum may include the first and second numbers. The rounding may be based on a predetermined step size in dB. The telemetry device 102 may transmit the compressed RDM value over a telemetry link to a receiving station 106. These embodiments will be described in more detail below.

Figure 4:
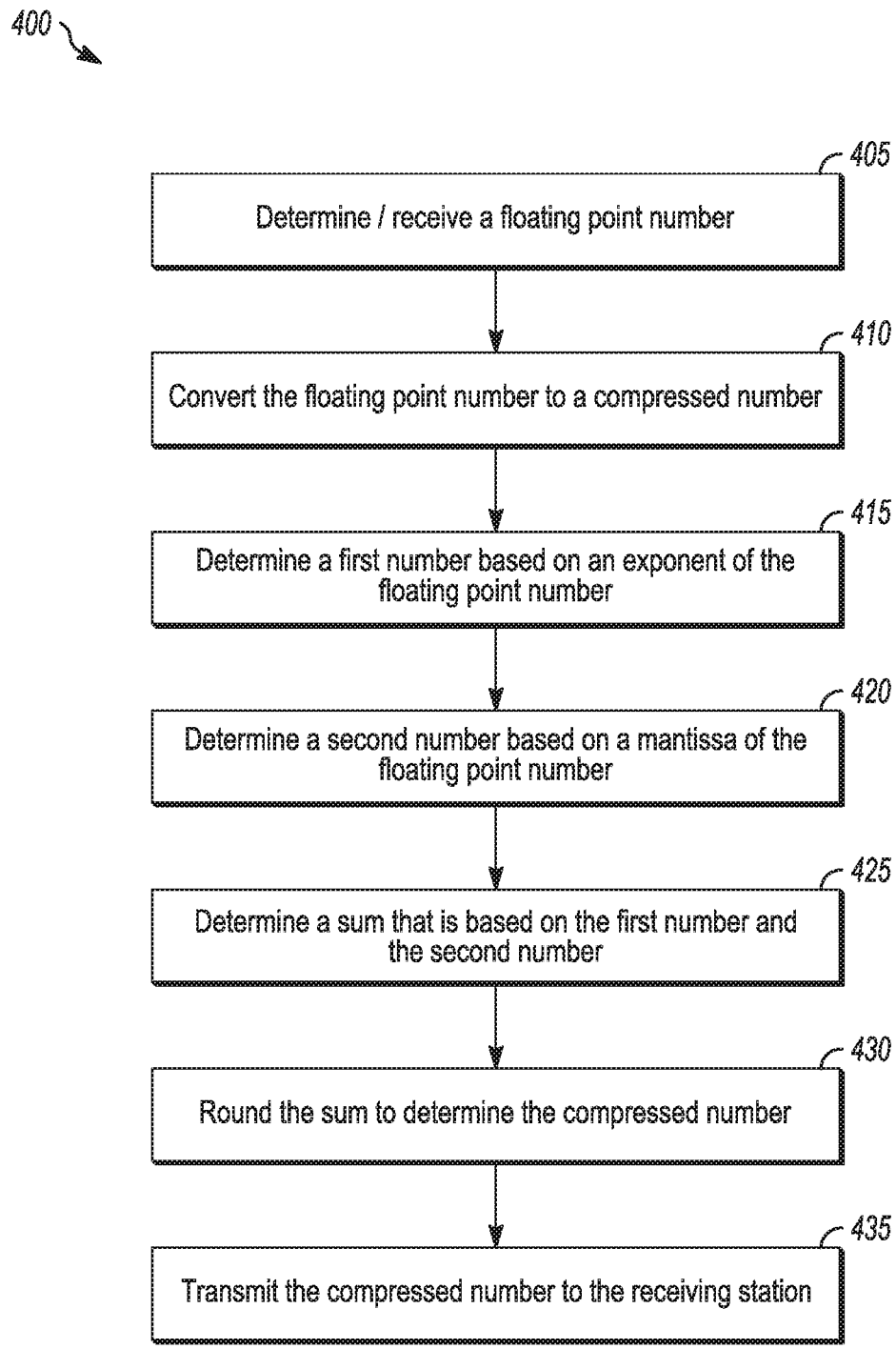
FIG. 4 illustrates the operation of a method in accordance with some embodiments.

FIG. 4 illustrates the operation of an example method in accordance with some embodiments. In some embodiments, the method 400 may be performed by the telemetry device 102, although the scope of embodiments is not limited in this respect. The method 400 may be performed by other devices and/or components in some embodiments. In some embodiments, operations of the method 400 may be performed by one or more components, including but not limited to one or more of the components of the machine 300 shown in FIG. 3. Those components may be included in the telemetry device 102 in some embodiments, although the scope of embodiments is not limited in this respect. In descriptions herein of techniques and/or operations, references may be made to components of the telemetry device 102, but such references are not limiting. The techniques and/or operations may be performed by other components (such as components shown in and/or described by any of FIGS. 1-8) which may or may not necessarily be included in a telemetry device 102, in some embodiments.

It is important to note that embodiments of the method 400 may include additional or even fewer operations or processes in comparison to what is illustrated in FIG. 4. In addition, embodiments of the method 400 are not necessarily limited to the chronological order that is shown in FIG. 4. In describing the method 400, reference may be made to FIGS. 1-3 and 5-8, although it is understood that the method 400 may be practiced with any other suitable systems, interfaces and components.

It should also be noted that the method 400 may be applicable to an apparatus for a telemetry device (such as 102 and/or other), in some embodiments. In some embodiments, the telemetry device 102 (and/or components of the telemetry device 102) may operate as part of a system such as an airborne device, aircraft, missile, computing device, computer, switch, router, mobile device and/or other device. Embodiments are not limited to these examples, however.

At operation 405, the telemetry device 102 may determine and/or receive a floating point number. In some embodiments, the floating point number may be determined and/or received with intention that it be transmitted to another device (including but not limited to the receiving station 106), although the scope of embodiments is not limited in this respect.

In some embodiments, the telemetry device 102 may determine the floating point number using one or more operations. In some embodiments, a component of the telemetry device (such as a sensor, processing circuitry and/or other) may generate/determine the floating point number.

In some embodiments, the telemetry device 102 may receive the floating point number from a component (such as a sensor and/or other component), although the scope of embodiments is not limited in this respect. In some embodiments, a component (such as a sensor and/or other component) may determine the floating point number, although the scope of embodiments is not limited in this respect. In a non-limiting example, the sensor and/or other component may be external to the telemetry device 102. In another non-limiting example, the sensor and/or other component may be included in the telemetry device 102. In another non-limiting example, the sensor and/or other component may be included in the telemetry device 102, may be part of the telemetry device 102.

In some embodiments, the floating point number may be a binary floating point number, although the scope of embodiments is not limited in this respect. In some embodiments, a binary floating point number may include a mantissa and an exponent. In a non-limiting example, the binary floating point number may be a product of: the mantissa, and the number two raised to a power equal to the exponent. The binary floating point number may be based on a base value of two, in some embodiments. The mantissa and/or the exponent may be binary numbers comprising bits, although the scope of embodiments is not limited in this respect.

Different options/variations in floating point formats are possible. In some embodiments, a floating point number may comprise a sign bit, although the scope of embodiments is not limited in this respect. In some embodiments, an exponent of the floating point number may be a biased exponent, although the scope of embodiments is not limited in this respect. In some embodiments, a floating point number may be based on a hidden value of the mantissa, although the scope of embodiments is not limited in this respect. In a non-limiting example, the hidden value may be always set to a value of 1 (binary). Accordingly, the bits of the mantissa given in the floating point format may represent a fractional portion that is less than 1.0. The mantissa may be considered as a sum of 1.0 and the fractional portion, in some cases. For instance, if the mantissa M is (1.0+fractional portion), and the exponent is N, the number represented by the floating point format may be $M*2^N$.

In a non-limiting example, the binary floating point format may include one or more of: a sign bit, 8 bits for the exponent, and 23 variable bits for the mantissa. The mantissa may be equal to a sum of the number 1.0 and a fractional portion based on the 23 variable bits for the mantissa, although the scope of embodiments is not limited in this respect. In some embodiments, the above values may be related to a standard, including but not limited to an IEEE 754 standard. The scope of embodiments is not limited to usage of floating point numbers that are included in a standard, however.

Embodiments are not limited to usage of binary floating point numbers or to usage of a base value of two. One or more of the techniques, operations and/or methods described herein may be performed using floating point numbers that are not binary. One or more of the techniques, operations and/or methods described herein may be performed using a base other than two.

One or more of the techniques, operations and/or methods described herein (such as conversion, compression and/or other) may be performed using a range Doppler map (RDM) value in a floating point format, although the scope of embodiments is not limited in this respect. Some descriptions herein may refer to a floating point number, including but not limited to operations performed on a floating point number, operations to generate a floating point number and/or other. In some embodiments, the floating point number may be an RDM value, although the scope of embodiments is not limited in this respect. One or more of the techniques, operations and/or methods described herein may be performed on other numbers/values, in some embodiments. For instance, a floating point number (binary or otherwise) may be converted to a compressed number using one or more of the techniques, operations and/or methods described herein, and the floating point number may not necessarily be an RDM value and may not even be related to RDM values. Some descriptions herein may refer to a compressed number, including but not limited to operations performed on a compressed number, operations to generate a compressed number and/or other. In some embodiments, the compressed number may be a compressed RDM value, although the scope of embodiments is not limited in this respect.

At operation 410, the telemetry device 102 may convert the floating point number to a compressed number. In some embodiments, the telemetry device 102 may perform one or more operations (including but not limited to one or more of operations 415-430 and/or other operation(s)) as part of the conversion of the floating point number to the compressed number, although the scope of embodiments is not limited in this respect.

In some embodiments, the compressed number may be in decibels (dB), although the scope of embodiments is not limited in this respect. In some embodiments, the compressed number may comprise bits, although the scope of embodiments is not limited in this respect. In a non-limiting example, the floating point number may be an RDM value and the compressed number may be a compressed RDM value.

In some embodiments, the floating point number (such as the RDM value and/or other) may comprise a number of bits and the compressed number (such as the compressed RDM value and/or other) may comprise a number of bits. In some embodiments, the number of bits of the compressed number may be less than the number of bits of the floating point number, although the scope of embodiments is not limited in this respect. In a non-limiting example, a compression ratio between the number of bits of the floating point number and the number of bits of the compressed number may be greater than one. For instance, if the floating point number comprises 32 bits and the compressed number comprises 8 bits, the compression ratio may be 4. Such a conversion from the floating point number to the compressed number may be referred to as 4:1 compression, in some cases.

In some embodiments, the compression ratio may be fixed, wherein the floating point number comprises a fixed number of bits (including but not limited to 32) and the compressed number also comprises a fixed number of bits (including but not limited to 8). For instance, a compression ratio between a size of the floating point number and a size of the compressed number may be constant, in some embodiments. Continuing the example above, the floating point number may comprise 32 bits, the compressed number may comprise 8 bits, and a fixed compression ratio of 4:1 may be used.

At operation 415, the telemetry device 102 may determine a first number based on an exponent of the floating point number. At operation 420, the telemetry device 102 may determine a second number based on a mantissa of the floating point number. At operation 425, the telemetry device 102 may determine a sum that is based on the first number and the second number. At operation 430, the telemetry device 102 may round the sum to determine the compressed number.

It should be noted that references to the "first number" and the "second number" herein are used for clarity, but are not limiting. In some cases, the term "first number" may be replaced by other terms, including but not limited to "first value," "first dB value," and/or other. In some cases, the term "second number" may be replaced by other terms, including but not limited to "second value," "second dB value," and/or other. It is understood that references herein to the "first number" are related to the first number determined at operation 415, and references herein to the "second number" are related to the second number determined at operation 420.

In some embodiments, the telemetry device 102 may perform one or more of operations 415-430 as part of the conversion of the floating point number to the compressed number, although the scope of embodiments is not limited in this respect. A non-limiting overview related to operations 415-430 is given below for clarity and organizational purposes, but this overview is not limiting.

In the overview, a binary floating point number may be represented by a mantissa M and an exponent N, and may be equal to M*2^N. The first number used in operations 415-430 may be related to compression, conversion, conversion to dB and/or other of the term 2^N. The second number used in operations 415-430 may be related to compression, conversion, conversion to dB and/or other of the term M. Recall that a logarithm of a product of two terms can be written as a sum of individual logarithms of the two terms. Accordingly, the sum determined in operation 425 may be related to compression, conversion, conversion to dB and/or other of the term M*2^N. At operation 430, the sum may be rounded to a nearest dB, to a nearest half-dB and/or other step size.

Some embodiments may be based at least partly on the above overview, along with potential variations related to scaling, biases, additive terms, constants of proportionality, implementation aspects and/or other, some of which are described below.

In some embodiments, the telemetry device 102 may determine the first number based on a product of the exponent and a constant. In a non-limiting example, the constant may be proportional to a logarithm of the number two, although the scope of embodiments is not limited in this respect. In some embodiments, a base-10 logarithm may be used. Embodiments are not limited to usage of a base-10 logarithm, however, as a logarithm of another base may be used, in some embodiments. In some embodiments, the constant may be pre-computed and/or predetermined.

In some embodiments, the constant may be equal to a product of: the number 10, and a base-10 logarithm of the number two. Embodiments are not limited to usage of the number 10 and are not limited to usage of a base of 10. Embodiments are also not limited to usage of the number two.

It should be noted that variations to the above numbers related to the constant are included in embodiments described herein. For instance, a constant that is similar to 10*log 10(2) may be used. Modifications (including but not limited to small modifications) to the numbers (10, 10, and 2) in the formula 10*log 10(2) are considered to be included in embodiments described herein. In a non-limiting example, a constant determined as 9.99*log 10(1.99) is considered to be included in embodiments described herein.

In some embodiments, the telemetry device 102 may determine the first number based on a product of the number 10, the exponent and a base-10 logarithm of the number two. In this example, the first number may be equal to 10*log 10(2^N), wherein N is the exponent of the floating point number, which may be a value in dB.

In some embodiments, the exponent may be a biased exponent. The telemetry device 102 may determine the first number based on a product of: a sum of the exponent and a predetermined bias term; and a constant (including but not limited to those described above). Accordingly, the telemetry device 102 may add the bias term to the exponent before multiplication by the constant, in some embodiments. In some embodiments, the bias term may be added or subtracted to the exponent in the above (that is, the telemetry device 102 may determine the first number based on a product of: a difference between the exponent and the predetermined bias term; and the constant). In some embodiments, the bias term may be equal to a negation of the bias term described above. In a non-limiting example, the bias term may be equal to a difference between: a) the number two raised to a power, wherein the power may be equal to the number of bits of the exponent minus the number one; and b) the number one. For instance, if the exponent is N, the bias term may be 2^(N−1)−1. The bias term may also be a negation of the above, such as −(2^(N−1)−1). In a non-limiting example, if N=8, the bias term may be 127 or −127. One or more operations such as the following may be performed: addition of the bias; subtraction of the bias; and/or other.

In some embodiments, the telemetry device 102 may determine the first number based on a product of: a sum of the exponent and a predetermined bias term; the number 10; and a base-10 logarithm of the number 2.

Non-limiting examples of determination of the second number are given below. In some embodiments, the telemetry device 102 may determine the second number using one or more bits of the mantissa as an index into a predetermined lookup table. In a non-limiting example, the one or more bits used as the index may be most significant bits (MSBs) of the mantissa.

In a non-limiting example, values of the lookup table may be proportional to logarithms of candidate mantissa values. In some embodiments, a base-10 logarithm may be used. Embodiments are not limited to usage of a base-10 logarithm, however, as a logarithm of another base may be used, in some embodiments. In some embodiments, the lookup table may be pre-computed and/or predetermined.

It should be noted that in some embodiments, at least some of the values of the lookup table may be proportional to logarithms of candidate mantissa values. Consider a lookup table for which some values of the lookup table are proportional to logarithms of candidate mantissa values, and some values of the lookup table are not necessarily proportional to the logarithms of candidate mantissa values. It is understood that such a lookup table may be considered a variation of the lookup table described herein, and usage of such a lookup table in operation 420 is included in the embodiments described herein. For instance, a lookup table for which a large number of values are proportional to logarithms of candidate mantissa values, but a small number of values are not proportional to logarithms of candidate mantissa values, is considered to be included in embodiments described herein.

In some embodiments, candidate mantissa values may be uniformly spaced. A spacing of the candidate mantissa values may be equal to a reciprocal of the number two raised to a power. The power may be equal to the number of bits of the mantissa used as the index into the lookup table. The candidate mantissa values may range/vary between: the number one, and a number equal to the number two minus the spacing. For instance, if 6 bits are used as the index into the lookup table, the spacing may be $1/(2^6)=1/64$, and the candidate mantissa values may range/vary between 1.0 and (2.0−1/64).

In a non-limiting example, the entries of the lookup table may be equal to products of: the number 10, and base-10 logarithms of the candidate mantissa values. Accordingly, the entries may correspond to dB values of the candidate mantissa values. Embodiments are not limited to usage of the number 10 and are not limited to usage of a base of 10.

In some embodiments, a number of entries in the lookup table may be equal to the number two raised to a power equal to the number of bits of the mantissa used as the index into the lookup table. For instance, if 6 bits are used, the number of entries of the lookup table may be $2^6=64$.

In some embodiments, the telemetry device 102 may determine the compressed number based on rounding of a sum. In some embodiments, the sum may include the first and second numbers. In some embodiments, the rounding may be based on a predetermined step size. In some embodiments, the step size may be in dB, although the scope of embodiments is not limited in this respect. In a non-limiting example, the step size may be 0.5 dB, 1.0 dB and/or other.

In some embodiments, a sum that includes the first and second numbers (including but not limited to a sum of the first and second numbers) may be used to determine the compressed number. In some embodiments, the sum may further includes a power gain scale factor. In a non-limiting example, the power gain scale factor may be based on one or more factors related to implementation, such as a number of bit shifts used to implement one or more operations of the conversion to the compressed value. In some embodiments, the factor may be equal to a product of: the number ten, and a base-10 logarithm of a number that is equal to the number two raised to a power, wherein the power is: equal to the number of bit shifts, or based on the number of bit shifts. In a non-limiting example, if the number of bit shifts is 0, then the power gain scale factor may be equal to $10*\log 10(2^0) = 0$. And if the number of bit shifts is 1, then the power gain scale factor may be equal to $10*\log 10(2)$.

Embodiments are not limited to the power gain scale factor described above. In some embodiments, the power gain scale factor may be used to limit a number (including but not limited to the first number described above) to a predetermined dynamic range. In some embodiments, the power gain scale factor may be based on one or more other aspects.

In some embodiments, the floating point number may comprise a sign bit, 8 bits for the exponent, and 23 bits for the mantissa. The bias term may be equal to negative 127. The number of MSBs of the mantissa used as the index into the lookup table may be 6. The compressed number may comprise 8 bits. A compression ratio between the number of bits of the floating point number and the number of bits of the compressed number may be 4-to-1.

The techniques, operations and/or methods to determine the compressed number are not limited to usage of dB values. For instance, if base-10 logarithms are used, the compressed number may be in dB. If logarithms of other bases are used, the compressed number may not necessarily be in dB. In some embodiments, the telemetry device 102 may convert the binary floating point number to a compressed number, wherein the binary floating point number comprises an exponent comprising bits, wherein the binary floating point number further comprises a mantissa comprising bits. The telemetry device 102 may determine the first number (of operation 415) based on a product of the exponent and a constant, wherein the constant is proportional to a logarithm of the number two. The telemetry device 102 may determine the second number (of operation 420) using one or more bits of the mantissa as an index into a predetermined lookup table, wherein values of the lookup table are proportional to logarithms of candidate mantissa values. The telemetry device 102 may determine the compressed number based on rounding of a sum, wherein the sum includes the first number and the second number, wherein the rounding is based on a predetermined step size. In some embodiments, a same base is used for: the logarithm of the number two that is used to determine the first number; and the logarithms of the candidate mantissa values that are used to determine the second number.

In a non-limiting example of the above, the constant used to determine the first number, the values of the lookup table, the compressed number and the step size may be in decibels (dB). The logarithm of the number two that is used to determine the first number may be a base-10 logarithm. The logarithms of the candidate mantissa values that are used to determine the second number may be base-10 logarithms.

At operation 435, the telemetry device 102 may transmit the compressed number. In some embodiments, the telemetry device 102 may transmit the compressed number to the receiving station 106, although the scope of embodiments is not limited in this respect. In some embodiments, the telemetry device 102 may transmit the compressed number on a telemetry link in wireless spectrum that is reserved for telemetry operation, although the scope of embodiments is not limited in this respect. As described herein, the compressed number may be a compressed RDM value in some embodiments, although the scope of embodiments is not limited in this respect.

Although descriptions may refer to generation and/or transmission of a compressed number, it is understood that the telemetry device 102 may transmit one or more compressed numbers, a packet that includes one or more compressed numbers and/or other element(s) related to compressed numbers.

It should be noted that the telemetry device may not necessarily transmit the compressed number, in some embodiments. For instance, the telemetry device 102 may store the compressed number in memory, in some embodiments.

Figure 5:
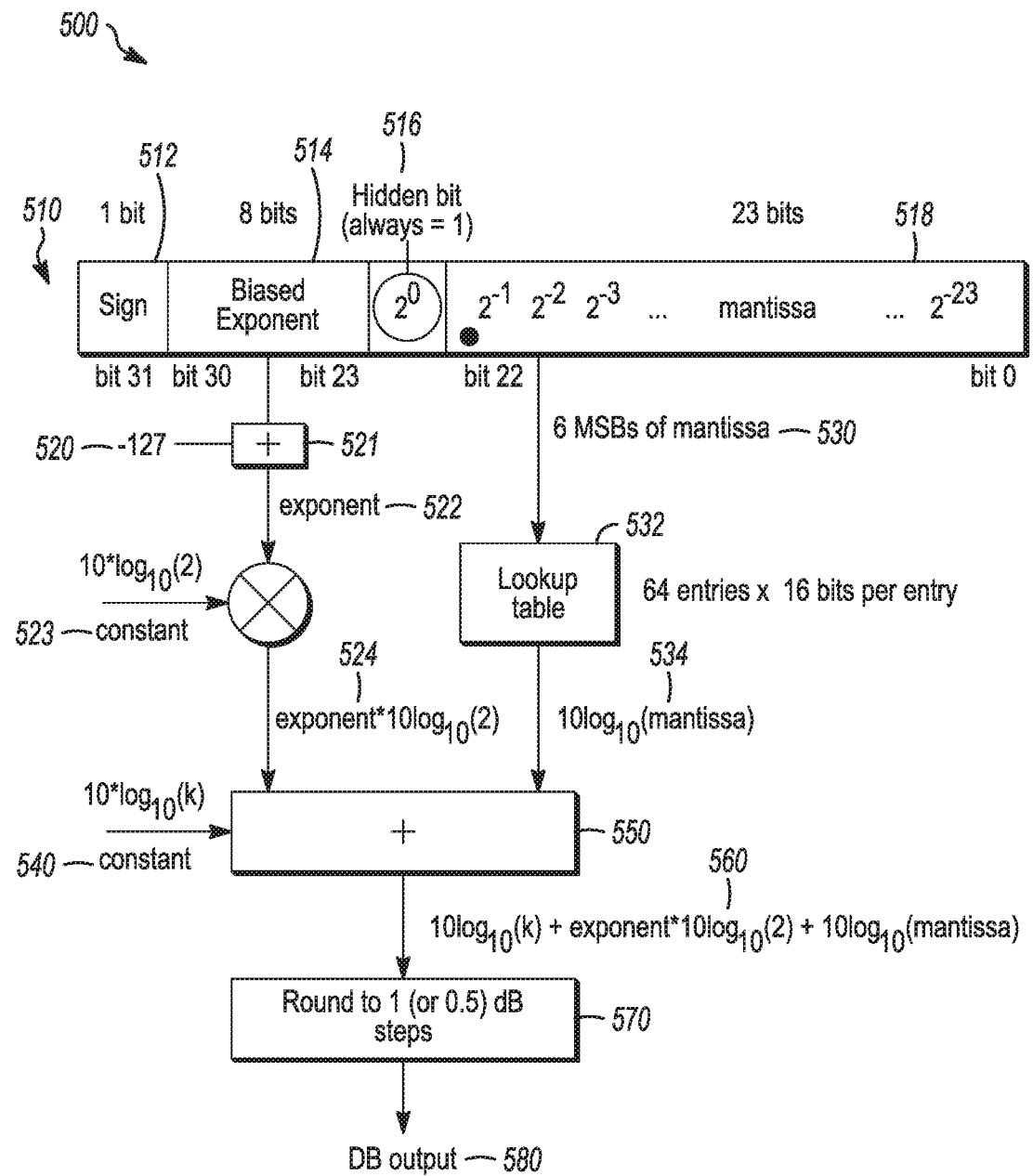
FIG. 5 illustrates example operations that may be used for compression of power values in accordance with some embodiments.
Figure 6:
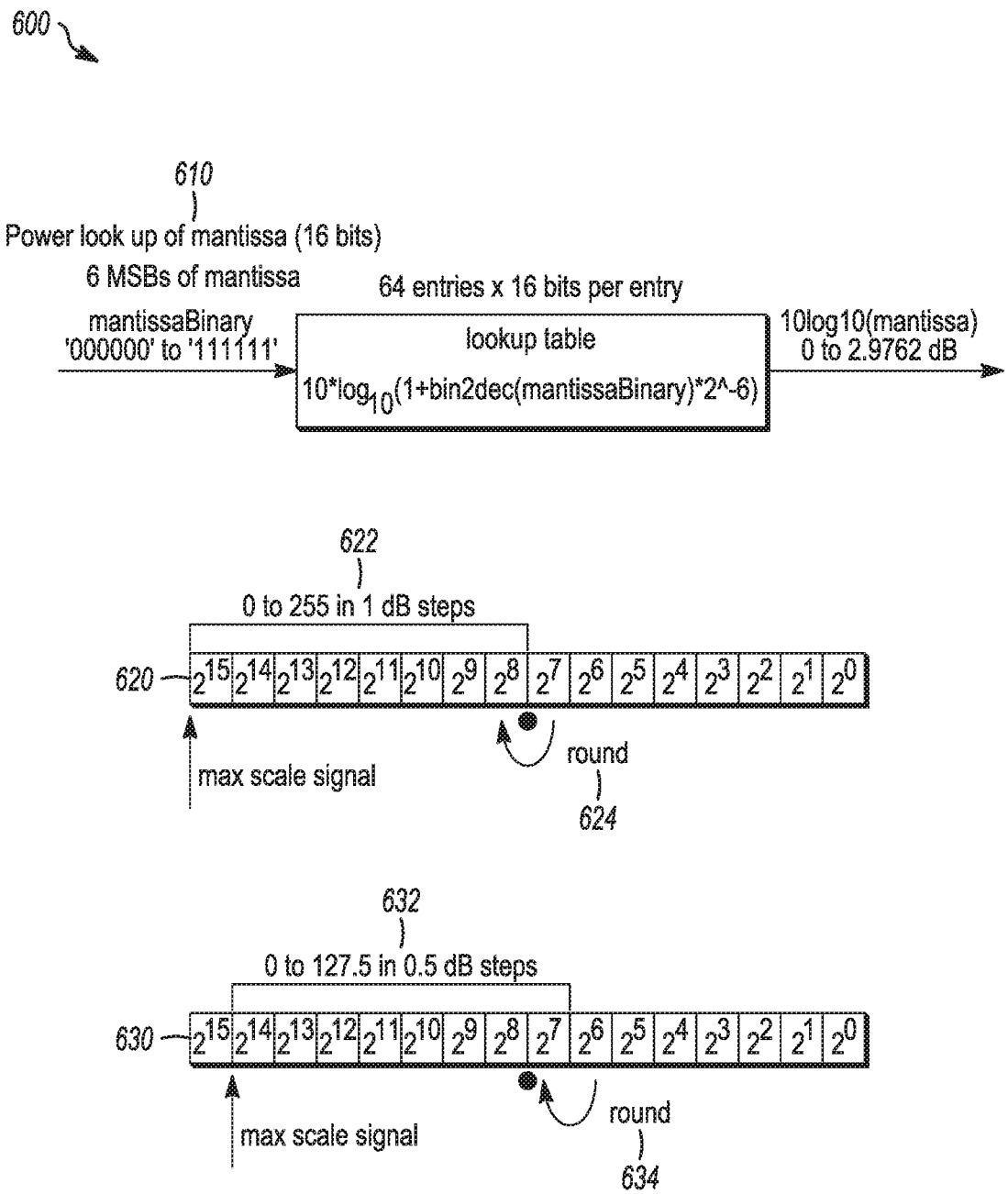
FIG. 6 illustrates example operations that may be used for compression of power values in accordance with some embodiments.
Figure 7:
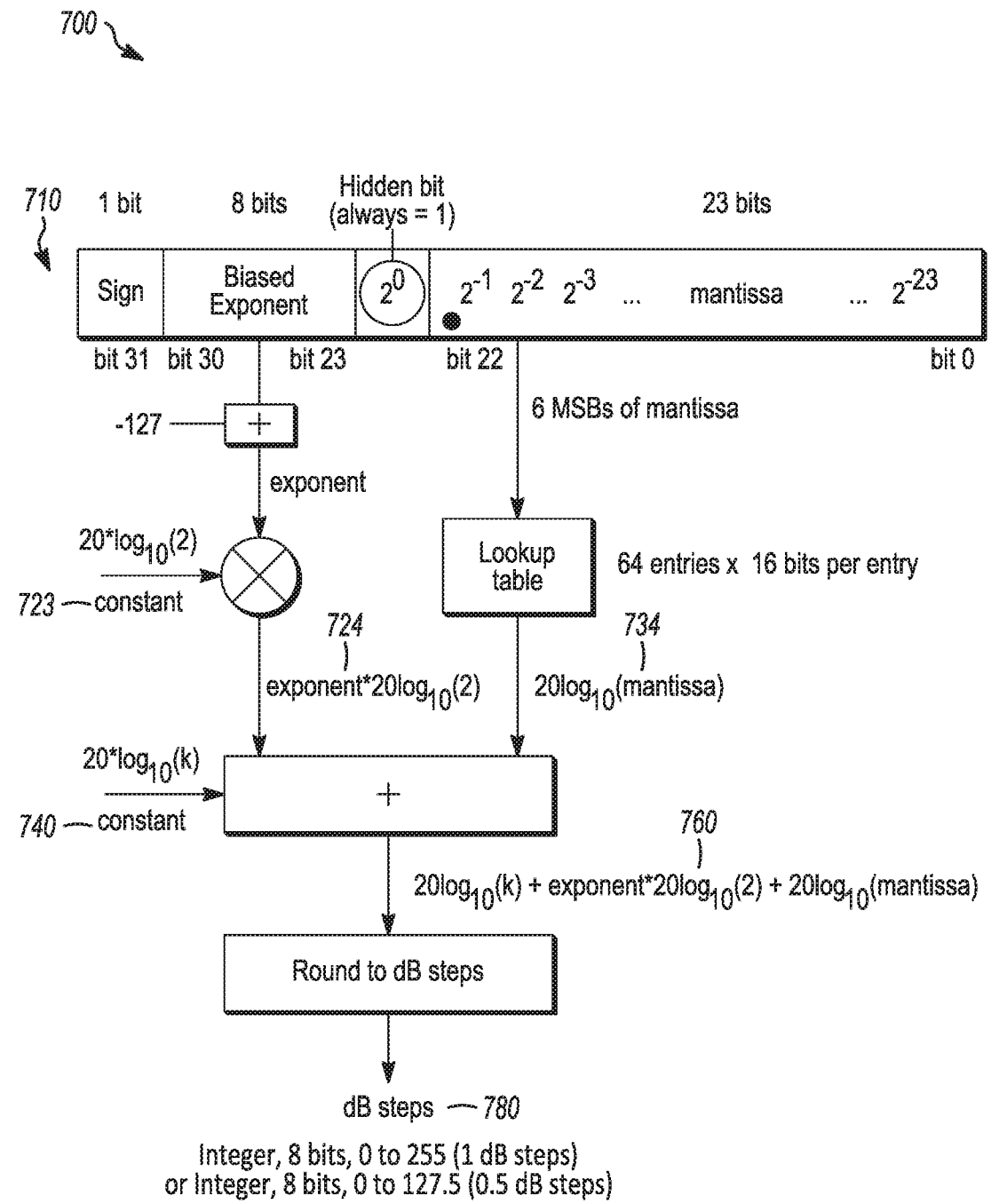
FIG. 7 illustrates example operations that may be used for compression of magnitude values in accordance with some embodiments.
Figure 8:
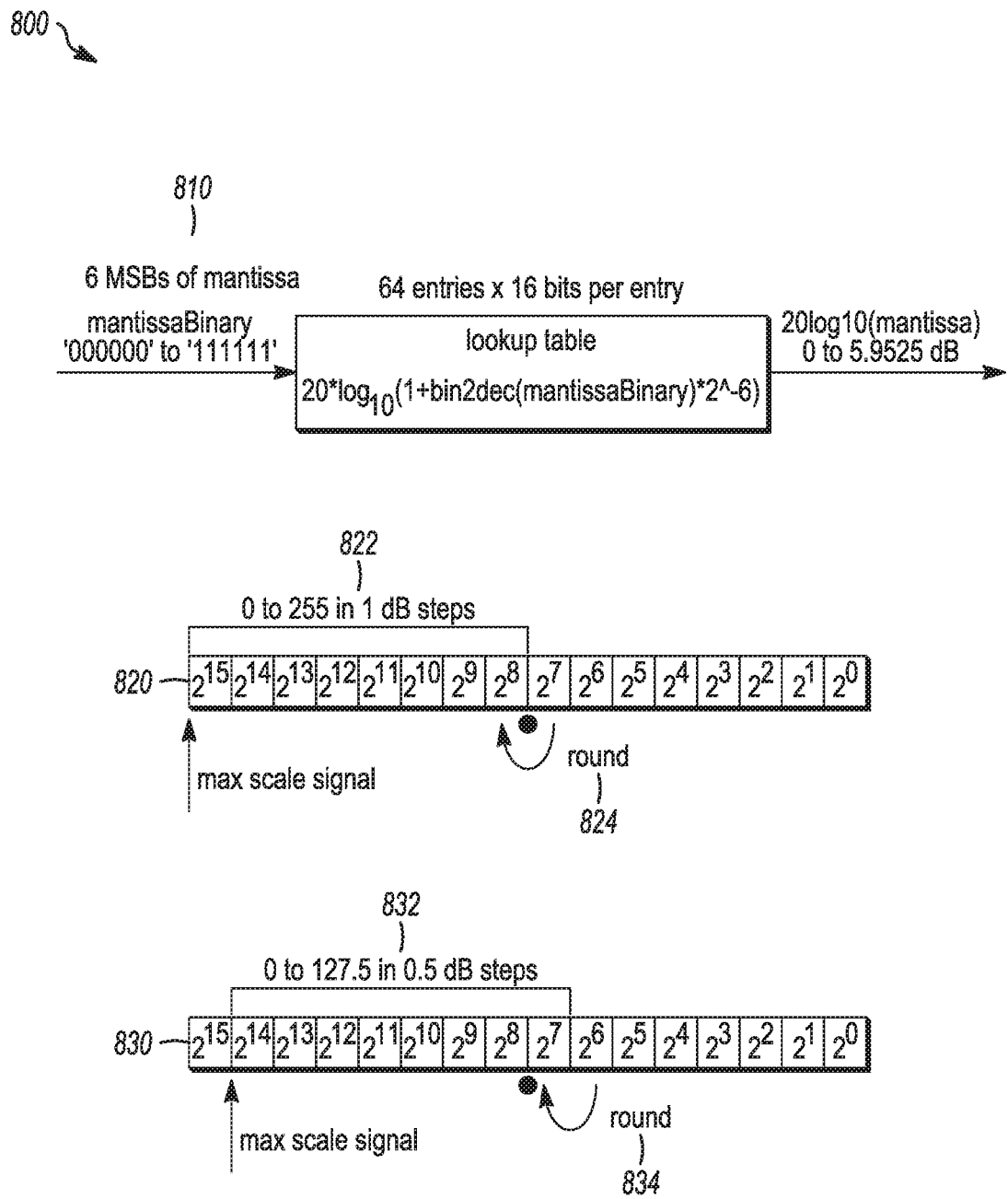
FIG. 8 illustrates example operations that may be used for compression of magnitude values in accordance with some embodiments.

FIG. 5 illustrates example operations that may be used for compression of power values in accordance with some embodiments. FIG. 6 illustrates example operations that may be used for compression of power values in accordance with some embodiments. FIG. 7 illustrates example operations that may be used for compression of magnitude values in accordance with some embodiments. FIG. 8 illustrates example operations that may be used for compression of magnitude values in accordance with some embodiments. It should be noted that the examples shown in FIGS. 5-8 may illustrate some or all of the concepts and techniques described herein in some cases, but embodiments are not limited by the examples. For instance, embodiments are not limited by the name, number, type, size, ordering, arrangement of elements (such as devices, operations, messages and/or other elements) shown in FIGS. 5-8.

Some embodiments may not necessarily include all operations shown. For instance, the telemetry device 102 may perform one or more operations shown in FIG. 5, but may not necessarily perform all of those operations, in some embodiments. In some embodiments, the telemetry device 102 may perform one or more additional operations not shown in FIGS. 5-8. For instance, the telemetry device 102 may perform one or more operations shown in FIG. 5, and one or more additional operations. In some embodiments, the telemetry device 102 may perform one or more operations that are similar to one or more operations shown in FIGS. 5-8.

In some embodiments, the floating point numbers 510, 710 may not necessarily include all fields shown. In some embodiments, the floating point numbers 510, 710 may include one or more additional fields not shown. Embodiments are not limited to the name, size, type and/or other aspects of the fields of the floating point numbers 510, 710 shown.

Referring to FIG. 5, the floating point number 510 is a power value, and is converted to a dB value 580. It should be recalled that a power value P is converted to dB as 10*log 10(P). The floating point number 510 includes a sign bit 512, an exponent (a biased exponent in this case, although embodiments are not limited as such) 514, a hidden bit 516, and a mantissa 518. A bias of −127 (indicated by 520) is added to the exponent 514 as indicated by 521. The result 522 is multiplied by a constant 523 of value equal to 10*log 10(2) to generate the result 524.

The 6 MSBs of the mantissa 518 (indicated by 530) are input to a lookup table 532 to generate the result 534. A different number of MSBs may be used. The lookup table has 64 (2^6) rows in this example. The lookup table 532 has 16 bits of precision in this example, although other sizes may be used.

The biased exponent 514 may be in a range of −126, . . . 127, and the exponent 522 may be in a range of 1, . . . 254. The values of 0 and 255 may correspond to special meanings of 0 and infinity, respectively.

The result 524, the result 534, and a constant 540 are added together to generate the result 560. In a non-limiting example, the constant 540 is equal to 10*log 10(k), wherein k may be equal to 2^0=1, or 2^1=2. As indicated by 570, the result 560 is rounded based on a step size in dB (0.5 dB or 1.0 dB in this example) to generate the output 580 in dB.

It should be noted that the constant 540 is not limited to the above example. Any number may be used, including but not limited to a number that causes a dynamic range to not be exceeded. In some embodiments, the dynamic range may be the dynamic range of 524 (in FIG. 5), although the scope of embodiments is not limited in this respect.

In some embodiments, the first number described regarding the method 400 may be related to 524, and the second number described regarding the method 400 may be related to 534. The scope of embodiments is not limited in this respect, however.

FIG. 6 illustrates, for the conversion of power values from floating point to dB, non-limiting examples of: usage of the lookup table (610), rounding to a step size of 1.0 dB (620), and rounding to a step size of 0.5 dB (630). In some embodiments, truncation may be used for the conversion of power values from floating point to dB. For instance, truncation may be used instead of rounding in 620, 630 and/or other operations described herein, in some embodiments. In some cases, the truncation may cause some loss of precision.

For conversion of magnitude values (referred to as "V" for clarity) using 20*log 10(V), examples in FIGS. 7-8 are similar to those shown in FIGS. 5-6.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A system comprising:
   a telemetry device comprising:
      processing circuitry; and
      memory storing instructions that, when executed by the processing circuitry, cause the telemetry device to:
         receive, from a sensor, an operating parameter of an airborne device as a range Doppler map (RDM) value in a binary floating point format, the RDM value comprising an exponent comprising bits, the RDM value comprising a mantissa comprising bits;
         convert the RDM value to a compressed RDM value in decibels (dB), the compressed RDM value comprising a plurality of bits, wherein the processing circuitry is configured to:
            determine a first number based on a product of the exponent and a constant, wherein the constant is proportional to a logarithm of the number two;
            determine a second number using one or more bits of the mantissa as an index into a predetermined lookup table, wherein values of the lookup table are proportional to logarithms of candidate mantissa values; and determine the compressed RDM value based on rounding of a sum, wherein the sum includes the first and second numbers, wherein the rounding is based on a predetermined step size in dB; and transmit the compressed RDM value over a telemetry link; and a receiving station in communication with the telemetry device, the receiving station receiving the compressed RDM value produced by the telemetry device over the telemetry link and processing the compressed RDM value to control at least one of speed, path, and destination of the airborne device.

2. The system according to claim 1, wherein:
the candidate mantissa values are uniformly spaced,
a spacing of the candidate mantissa values is equal to a reciprocal of the number two raised to a power, the power equal to the number of bits of the mantissa used as the index into the lookup table, and
the candidate mantissa values range between:
a number equal to one, and
a number equal to two minus the spacing.

3. The system according to claim 1, wherein the entries of the lookup table are equal to products of:
the number 10, and
base-10 logarithms of the candidate mantissa values.

4. The system according to claim 1, wherein a number of entries in the lookup table is equal to the number two raised to a power equal to the number of bits of the mantissa used as the index into the lookup table.

5. The system according to claim 1, wherein the one or more of the bits of the mantissa that are used as the index into the lookup table are most significant bits (MSBs) of the mantissa.

6. The system according to claim 1, wherein the constant used to determine the first number is equal to a product of:
the number 10, and
a base-10 logarithm of the number two.

7. The system according to claim 1, the processing circuitry further configured to:
determine the first number based on a product of:
a sum of the exponent and a predetermined bias term, and
the constant that is proportional to the logarithm of the number two.

8. The system according to claim 7, wherein:
the bias term is based on a difference between:
the number two raised to a power, the power equal to the number of bits of the exponent minus the number one, and
the number one.

9. The system according to claim 1, wherein:
the sum used to determine the compressed RDM value further includes a power gain scale factor based on a number of bit shifts used to implement one or more operations of the conversion of the RDM value to the compressed RDM value, wherein the power gain scale factor is equal to a product of:
the number ten, and
a base-10 logarithm of a number that is equal to the number two raised to a power, wherein the power is based on the number of bit shifts used.

10. The system according to claim 1, wherein:
the sum used to determine the compressed RDM value further includes a predetermined power gain scale factor that limits the first number to a predetermined dynamic range.

11. The system according to claim 1, wherein:
the binary floating point format represents the RDM value as a product of:
the mantissa, and
the number two raised to a power equal to the exponent.

12. The system according to claim 11, wherein:
the binary floating point format includes:
a sign bit,
8 bits for the exponent, and
23 variable bits for the mantissa,
wherein the mantissa is equal to a sum of the number 1.0 and a fractional portion based on the 23 variable bits for the mantissa.

13. The system according to claim 1, wherein a compression ratio between a size of the RDM value and a size of the compressed RDM value is constant.

14. The system according to claim 1, wherein the processing circuitry is configured to transmit the compressed RDM value on a telemetry link in wireless spectrum that is reserved for telemetry operation.

15. A method of converting an operating parameter of an airborne device from a range Doppler map (RDM) value in a binary floating point format to a compressed RDM value in decibels (dB), performed by a telemetry device comprising a processing circuitry, a memory storing instructions that are executed by the processing circuitry, the method comprising:
receiving, from a sensor, the RDM value in the binary floating point format, the RDM value comprising an exponent comprising bits, the RDM value comprising a mantissa comprising bits;
determining, by the processing circuitry, a first number based on a product of: a sum of the exponent and a predetermined bias term, the number 10, and a base-10 logarithm of the number 2;
determining, by the processing circuitry, a second number using one or more most significant bits (MSBs) of the mantissa as an index into a predetermined lookup table, wherein values of the lookup table are equal to products of: the number 10, and a base-10 logarithm of a range of candidate mantissa values;
determining, by the processing circuitry, the compressed number in dB by rounding, in accordance with a predetermined step size in dB, of a sum that includes the first number and the second number,
wherein the compressed RDM value comprises a plurality of bits; and
transmitting the compressed RDM value, produced by the telemetry device, to a receiving station via a telemetry link, where the compressed RDM value is processed, by the receiving station, to control at least one of speed, path, and destination of the airborne device.

16. The method according to claim 15, wherein:
the RDM value comprises a sign bit, 8 bits for the exponent, and 23 bits for the mantissa,
the predetermined bias term is equal to negative 127,
the number of MSBs of the mantissa used as the index into the lookup table is 6,
the compressed number comprises 8 bits, and
a compression ratio between the number of bits of the RDM value and the number of bits of the compressed number is 4-to-1.

17. The method according to claim 15, wherein:
the sum used to determine the compressed RDM value further includes a power gain scale factor based on:
a number of bit shifts used to implement one or more operations of the conversion of the RDM value to the compressed RDM value, or
a scaling of the first number that limits the first number to a predetermined dynamic range.

* * * * *